US012568642B2

(12) United States Patent
Peng et al.

(10) Patent No.: US 12,568,642 B2
(45) Date of Patent: Mar. 3, 2026

(54) SGT MOSFET DEVICE AND MANUFACTURING METHOD OF CONTACT HOLES OF SGT MOSFET DEVICE

(71) Applicant: CHONGQING ALPHA AND OMEGA SEMICONDUCTOR LIMITED, Chongqing (CN)

(72) Inventors: Fei Peng, Chongqing (CN); Yi Zhao, Chongqing (CN); Liang Shi, Chongqing (CN)

(73) Assignee: CHONGQING ALPHA AND OMEGA SEMICONDUCTOR LIMITED, Chongqing (CN)

( * ) Notice: Subject to any disclaimer, the term of this patent is extended or adjusted under 35 U.S.C. 154(b) by 357 days.

(21) Appl. No.: 18/358,909

(22) Filed: Jul. 25, 2023

(65) Prior Publication Data

US 2023/0369461 A1     Nov. 16, 2023

Related U.S. Application Data

(63) Continuation of application No. PCT/CN2022/079227, filed on Mar. 4, 2022.

(30) Foreign Application Priority Data

Mar. 12, 2021    (CN) .......................... 202110271647.8

(51) Int. Cl.
   *H10D 30/01*      (2025.01)
   *H10D 64/27*      (2025.01)
   *H10P 30/22*      (2026.01)

(52) U.S. Cl.
   CPC ......... *H10D 30/025* (2025.01); *H10D 64/513* (2025.01); *H10P 30/22* (2026.01)

(58) Field of Classification Search
None
See application file for complete search history.

(56) References Cited

U.S. PATENT DOCUMENTS

2008/0258224 A1* 10/2008 Hshieh ................. H10D 89/611
                                          438/237
2013/0075810 A1    3/2013 Hsieh
(Continued)

FOREIGN PATENT DOCUMENTS

CN    108389858 A    8/2018
CN    111081779 A    4/2020
CN    113035840 A    6/2021

OTHER PUBLICATIONS

A MOS Transistor Switch, Preparation Method Thereof and Electronic Device Comprising the Same; 2018. (Year: 2018).*
(Continued)

*Primary Examiner* — Nilufa Rahim

(57) ABSTRACT

An SGT MOSFET device and a manufacturing method of contact holes of the SGT MOSFET device relate to a field of power semiconductor device manufacturing. The manufacturing method includes steps of preparing a gate trench, source trenches, a shielding gate trench, and a pre-embedded ESD trench, preparing a cell structure, preparing an ESD region, a body region, and a source region by ion implantation and preparing a gate contact hole, a source contact hole, a shield gate contact hole, and ESD contact holes. By pre-embedding an ESD structure, depth differences between the gate contact hole, the source contact hole, the shielding gate contact hole, and the ESD contact holes are reduced, and the contact holes are prepared by only one photolithography process. The manufacturing method reduces one photolithography process and one process of growing ESD polysilicon, saves cost, and reduces difficulty of the manufacturing process.

9 Claims, 8 Drawing Sheets

(56) References Cited

U.S. PATENT DOCUMENTS

| | | | | |
|---|---|---|---|---|
| 2017/0278837 | A1* | 9/2017 | Hsieh | .................. H10D 64/117 |
| 2020/0135713 | A1 | 4/2020 | Lin | |
| 2020/0303507 | A1* | 9/2020 | Yilmaz | ............... H10D 64/117 |

OTHER PUBLICATIONS

Production Method of the Trench Etching Process Technique and Diode; 2019. (Year: 2019).*

International Search Report issued in corresponding International application No. PCT/CN2022/079227, mailed Apr. 25, 2022.

Written Opinion of the International Search Authority in corresponding International application No. PCT/CN2022/079227.

* cited by examiner

SGT MOSFET DEVICE AND MANUFACTURING METHOD OF CONTACT HOLES OF SGT MOSFET DEVICE

TECHNICAL FIELD

The present disclosure relates to a field of power semiconductor device manufacture, in particular to a split-gate-trench (SGT) metal-oxide-semiconductor field-effect transistor (MOSFET) device and a manufacturing method of contact holes of the SGT MOSFET device, and further in particular to a manufacturing method of contact holes of the SGT MOSFET device with an electro-static discharge (ESD) structure.

BACKGROUND

Trench power devices are widely used in a field of power management because of advantages such as low on-resistance and high integration. Compared with trench metal-oxide-semiconductor field-effect transistor (MOSFET) devices, a split-gate-trench (SGT) is favored by the market due to advantages such as small on-resistance and parasitic capacitance, and high integration.

The Chinese patent No.CN105702739B discloses a MOSFET device with a shielding gate trench and a manufacturing method thereof. The Chinese patent No. CN108389858A discloses a MOSFET device with a shielding gate trench and an integrated electro-static discharge (ESD) protection diode and a manufacturing method thereof. The Chinese patent No. CN107808903A discloses a MOSFET device with a shielding gate trench and a manufacturing method thereof.

A current SGT structure with an ESD structure needs to make a plurality of contact holes in the manufacturing process. As shown in FIG. 1, due to a specific structure of the SGT structure, depth differences between a gate contact hole ①, a source contact hole ②, a shielding gate contact hole ③, and ESD contact holes ④ are large, so it is extremely difficult to prepare the above contact holes through a single photolithography process.

A conventional manufacturing method is to obtain the contact holes through a plurality of photolithography processes. Specifically, at least two photolithography process are performed to obtain all of the contact holes. For instance, the gate contact hole ①, the source contact hole ②, and the shielding gate contact hole ③ are prepared through a first photolithography process, and then the ESD contact holes ④ is prepared through a second photolithography process. The conventional manufacturing method requires the at least two photolithography processes, which is complex and costly.

SUMMARY

In order to solve defects in the present disclosure, a purpose of the present disclosure is to provide a split-gate-trench (SGT) metal-oxide-semiconductor field-effect transistor (MOSFET) device and a manufacturing method of contact holes of the SGT MOSFET device.

To achieve the above purpose, the present disclosure provides the manufacturing method of the contact holes of the SGT MOSFET device. The manufacturing method comprises following steps:

A: preparing a gate trench, source trenches, a shielding gate trench, and a pre-embedded electro-static discharge (ESD) trench;

B: preparing a cell structure;

C: preparing an ESD region, a body region, and a source region by ion implantation; and D: preparing a gate contact hole, a source contact hole, a shield gate contact hole, and ESD contact holes.

Optionally, the step A comprises steps:

S1: preparing an epitaxial layer on an upper surface of a silicon substrate by chemical vapor deposition (CVD); depositing an oxide layer mask on an upper surface of the epitaxial layer; where the epitaxial layer is doped with a trivalent element or a pentavalent element; and S2: spin-coating a first photoresist on an upper surface of the oxide layer mask, defining a trench pattern by exposing the first photoresist under yellow light; and obtaining the pre-embedded ESD trench, the gate trench, the shielding gate trench, and the source trenches by dry etching, and removing the first photoresist after the dry etching is completed.

The pre-embedded ESD trench, the gate trench, the shielding gate trench, and the source trenches are sequentially arranged.

Optionally, in the step S1, the epitaxial layer is a single-layer structure or a multi-layer structure. The epitaxial layer has a thickness of 0.5-10 microns. The oxide layer mask comprises silicon dioxide or silicon nitride.

Optionally, the step B comprises:

S3: growing an insulating layer on upper surfaces of the pre-embedded ESD trench, the gate trench, the shielding gate trench, and the source trenches by a thermal oxidation method; growing a first polysilicon layer on an upper surface of the insulating layer; where the first polysilicon layer completely fills the pre-embedded ESD trench, the gate trench, the shielding gate trench, and the source trenches;

S4: removing a portion of the first polysilicon layer above a mask layer by chemical mechanical polishing, and then etching remaining first polysilicon layer by the dry etching; where a height of the first polysilicon layer after the dry etching is 0.1-1 $\mu$m; the first polysilicon layer after the dry etching is respectively arranged inside the pre-embedded ESD trench, the gate trench, the shielding gate trench, and the source trenches;

S5: depositing an oxide layer by high density plasma (HDP) CVD; planarizing the oxide layer through chemical mechanical polishing (CMP); where the oxide layer completely fills the pre-embedded ESD trench, the gate trench, the shielding gate trench, and the source trenches;

S6: etching portions of the oxide layer arranged inside the gate trench, the pre-embedded ESD trench, and the source trenches to form a shielding oxide layer; where a thickness of the shielding oxide layer is 50-500 nm;

S7: removing a portion of the oxide layer arranged inside the gate trench by wet etching; growing a gate oxide layer on the upper surfaces of the source trenches by the thermal oxidation method; growing a second polysilicon layer on the gate oxide layer and an upper surface of the shielding oxide layer through a furnace tube; where a thickness of the gate oxide layer is 10-1000 nm; the second polysilicon layer completely fills the pre-embedded ESD trench, the gate trench, the shielding gate trench, and the source trenches; and S8: planarizing the second polycrystalline silicon layer through the CMP, etching the second polycrystalline silicon layer through the dry etching; where an etching depth of the second polycrystalline silicon layer is 20-200 nm.

Optionally, in the step S3, a thickness of the insulating layer is 20-500 nm. A thickness of the first polysilicon layer is 100-1200 nm. A thickness of the oxide layer in the step S5 is 500-3000 nm. A thickness of the second polysilicon layer in the step S7 is 100-1200 nm.

Optionally, the step C further comprises:

S9: exposing a pattern of a mask to a second photoresist by the yellow light, obtaining the ESD region on the pre-embedded ESD trench by performing the ion implantation on a portion of the second polysilicon layer arranged in the ESD trench, where first impurities doped in the ESD region and implanted by the ion implantation comprise the trivalent element (for an N-type MOSFET) or the pentavalent element (for a P-type MOSFET); performing thermal activation on the first impurities;

S10: obtaining the body region by performing the ion implantation on a region between the gate trench and the shielding gate trench, a region between the shielding gate trench and the source trench, a region between the shielding gate trench and the source trenches, a region between the source trenches, and an upper portion of a portion of the epitaxial layer arranged on one side of the source trenches away from the gate trench; where second impurities doped in the body region and implanted by the ion implantation comprise the trivalent element (for the N-type MOSFET) or the pentavalent element (for the P-type MOSFET); performing thermal activation on the second impurities;

S11: exposing the pattern of the mask to the third photoresist through the yellow light, obtaining the source region by performing the ion implantation on the region between the source trenches and the upper portion of the one side of the source trenches away from the gate trench; where third impurities doped in the source region and implanted by the ion implantation comprise the trivalent element (for the P-type MOSFET) or the pentavalent element (for the N-type MOSFET); and S12: growing a silicon dioxide insulating layer on an upper surface of the cell structure by the CVD.

Optionally, the trivalent element in the steps S9-S11 comprises boron. The pentavalent element in the steps S9-S11 comprises arsenic or phosphorus. In the step S12, the silicon dioxide insulating layer is doped with fourth impurities. The fourth impurities comprise boron and phosphorus.

Optionally, the step D further comprises:

S13: exposing the pattern of the mask on the fourth photoresist by the yellow light, and obtaining the gate contact hole, the source contact hole, the shielding gate contact hole, and the ESD contact holes by the dry etching; and removing the fourth photoresist after the dry etching.

Optionally, a lower end of the gate contact hole is located in a middle of the second polysilicon layer in the gate trench. A lower end of the source contact hole is located in a middle of the body region between the source trenches. A lower end of the shielding gate contact hole is located in a middle of a portion of the first polysilicon layer arranged in the shielding gate trench. A lower end of each of the ESD contact holes is located in a middle of the second polysilicon layer in the ESD trench after ESD ion implantation.

The present disclosure further provides the SGT MOSFET device. Contact holes of the SGT MOSFET device are prepared by the manufacturing method mentioned above.

In summary, compared with the prior art, in the present disclosure, during a preparing process of the contact holes of the SGT MOSFET device with an ESD structure, by pre-embedding the ESD structure into the SGT MOSFET device, depth differences between the gate contact hole, the source contact hole, the shielding gate contact hole, and the ESD contact holes are reduced, and all of the contact holes are prepared by only one photolithography process.

The manufacturing method reduces a photolithography process and a process of growing an ESD polysilicon, and saves cost.

Moreover, the manufacturing method reduces difficulty of a manufacturing process.

BRIEF DESCRIPTION OF DRAWINGS

Other characteristics, purposes, and advantages of the present disclosure will be apparent by reading following detailed description of non-limiting embodiments with reference to following drawings.

IN THE DRAWINGS

1—Silicon substrate; 2—Epitaxial layer; 3—oxide layer mask; 4—Gate trench; 5—Source trench; 6—ESD trench; 7—First polysilicon layer; 8—oxide; 9—gate oxide layer; 10—second polysilicon layer; 11—ESD region; 12—body region; 13—source region; 14—silicon dioxide insulating layer.

DETAILED DESCRIPTION

The following embodiments will help those skilled in the art to further understand the present disclosure, but do not limit the present disclosure in any form. Those skilled in the art can make changes and improvements without departing from the concept of the present disclosure, all of which should fall within the protection scope of the present disclosure. The endpoints and any values of ranges disclosed herein are not limited to the precise range or value, which should be understood to include values close to the ranges or values. For a numerical range, one or more new numerical ranges may be obtained by combining endpoint values of various ranges, endpoint values of various ranges, separate point values, and separate point values, which should be considered as specifically disclosed by the present disclosure. The present disclosure is described in detail below with reference to specific embodiments.

Embodiment 1

Figure 3:
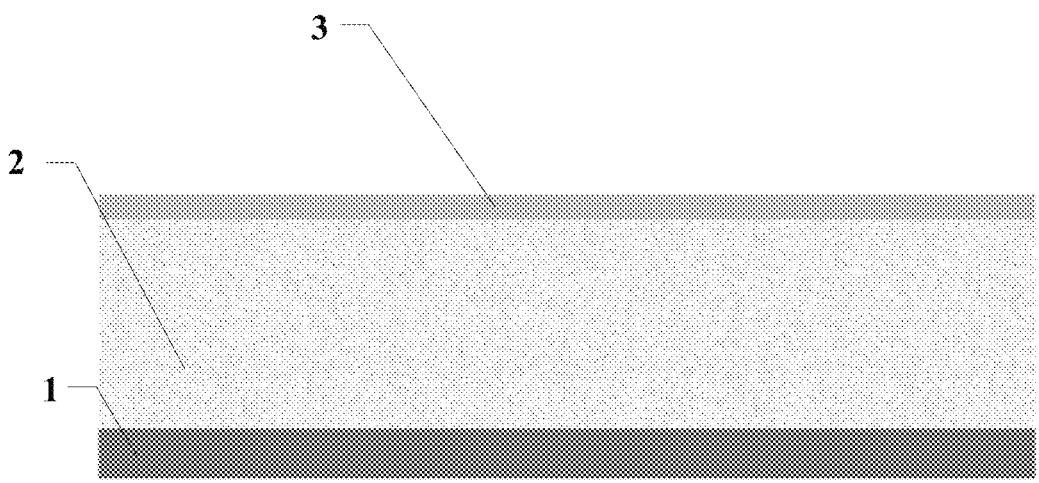
FIG. 3 is a process schematic diagram of step S1 of a manufacturing method of contact holes of the SGT MOSFET device according to Embodiments 1-3 of the present disclosure.

The present disclosure provides a manufacturing method of contact holes of the SGT MOSFET device. The manufacturing method comprises following steps:

S1: as shown in FIG. 3, preparing an epitaxial layer 2 on an upper surface of a silicon substrate 1 by chemical vapor deposition (CVD); depositing an oxide layer mask 3 on an upper surface of the epitaxial layer 2 according to polarity of a MOSFET.

The epitaxial layer 2 is doped with a trivalent element or a pentavalent element. The epitaxial layer 2 is a single-layer structure according to an operation voltage. The epitaxial layer 2 has a thickness of 0.7 microns. The oxide layer mask 3 comprises silicon dioxide or silicon nitride.

Figure 4:
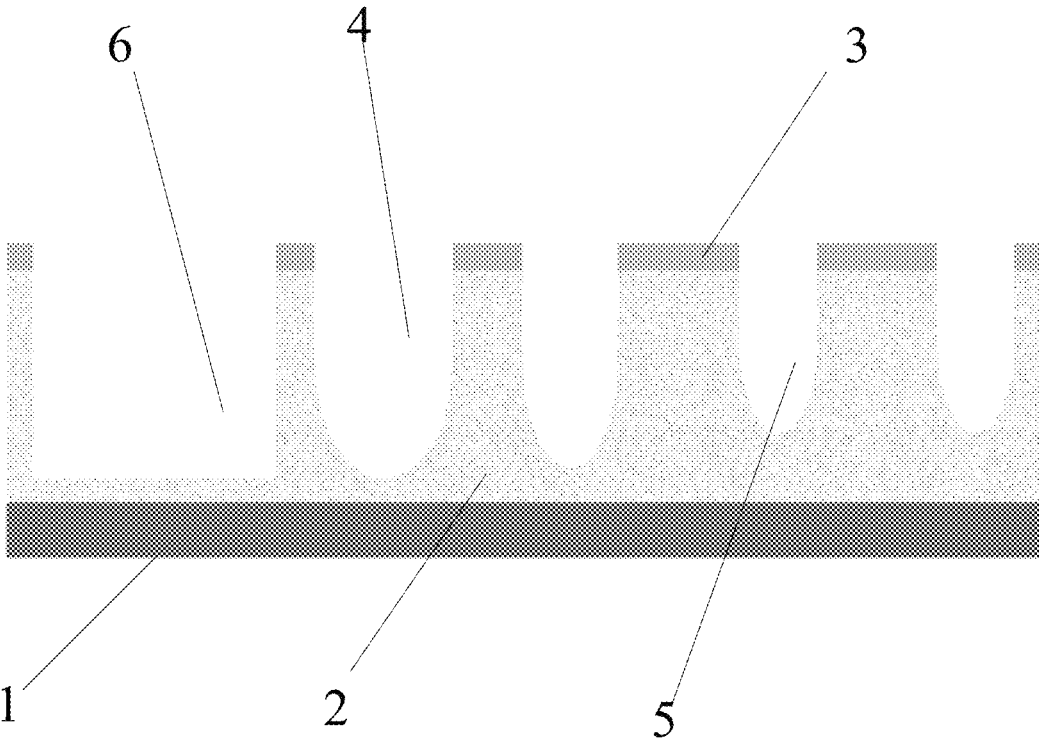
FIG. 4 is a process schematic diagram of step S2 of the manufacturing method of the contact holes of the SGT MOSFET device according to Embodiments 1-3 of the present disclosure.
Figure 5:
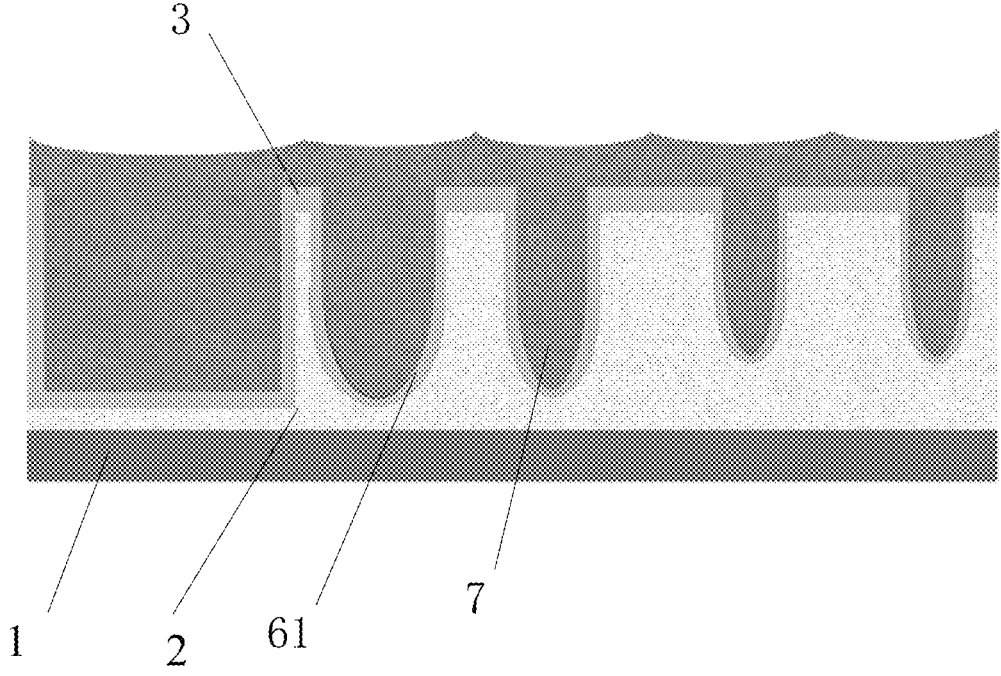
FIG. 5 is a process schematic diagram of step S3 of the manufacturing method of the contact holes of the SGT MOSFET device according to Embodiments 1-3 of the present disclosure.
Figure 6:
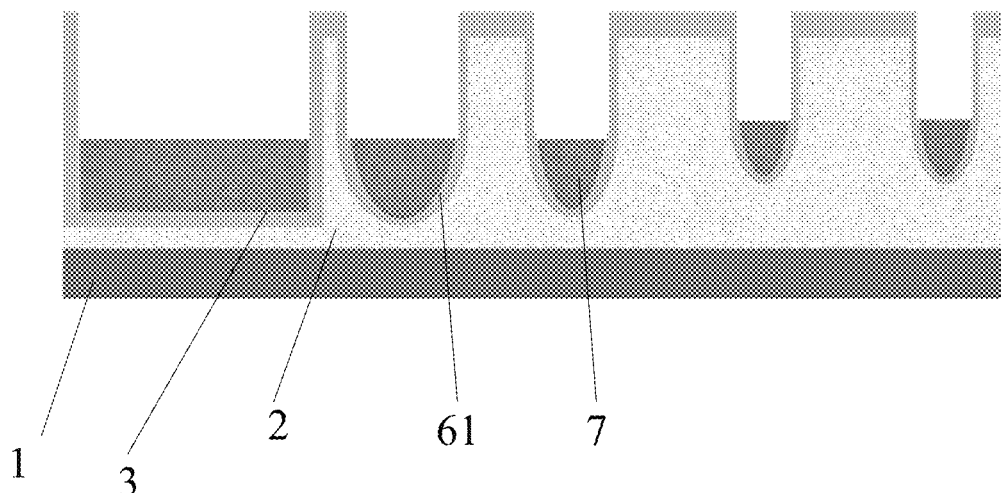
FIG. 6 is a process schematic diagram of step S4 of the manufacturing method of the contact holes of the SGT MOSFET device according to Embodiments 1-3 of the present disclosure.

S2: as shown in FIG. 4, preparing a gate trench 4, source trenches 5, a shielding gate trench, and a pre-embedded electro-static discharge (ESD) trench 6, specifically, spin-coating a first photoresist on an upper surface of the oxide layer mask 3, defining a trench pattern by exposing the first photoresist under yellow light; and obtaining the pre-embedded ESD trench 6, the gate trench 4, the shielding gate trench, and the source trenches 5 by dry etching, and removing the first photoresist after the dry etching is completed;

S3: as shown in FIG. 5, growing an insulating layer 61 having a thickness of 250 nm on upper surfaces of the pre-embedded ESD trench 6, the gate trench 4, the shielding gate trench, and the source trenches 5 by a thermal oxidation method; growing a first polysilicon layer 7 having a thickness of 700 nm on an upper surface of the insulating layer 61;

The first polysilicon layer 7 completely fills the pre-embedded ESD trench, the gate trench, the shielding gate trench, and the source trenches;

S4: as shown in FIG. 6, removing a portion of the first polysilicon layer 7 above a mask layer by chemical mechanical polishing, and then etching remaining first polysilicon layer 7 by the dry etching;

A height of the first polysilicon layer 7 after the dry etching is 0.1-1 μm.

Figure 7:
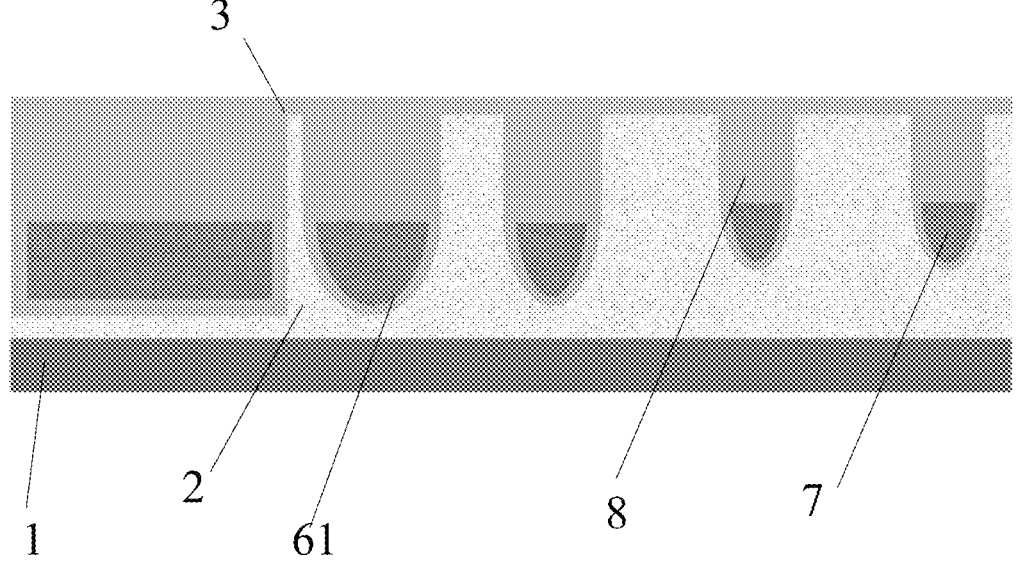
FIG. 7 is a process schematic diagram of step S5 of the manufacturing method of the contact holes of the SGT MOSFET device according to Embodiments 1-3 of the present disclosure.

S5: as shown in FIG. 7, depositing an oxide layer 8 having a thickness of 1800 nm by high density plasma (HDP) CVD; planarizing the oxide layer 8 through chemical mechanical polishing (CMP);

The oxide layer 8 completely fills the pre-embedded ESD trench, the gate trench, the shielding gate trench, and the source trenches.

Figure 8:
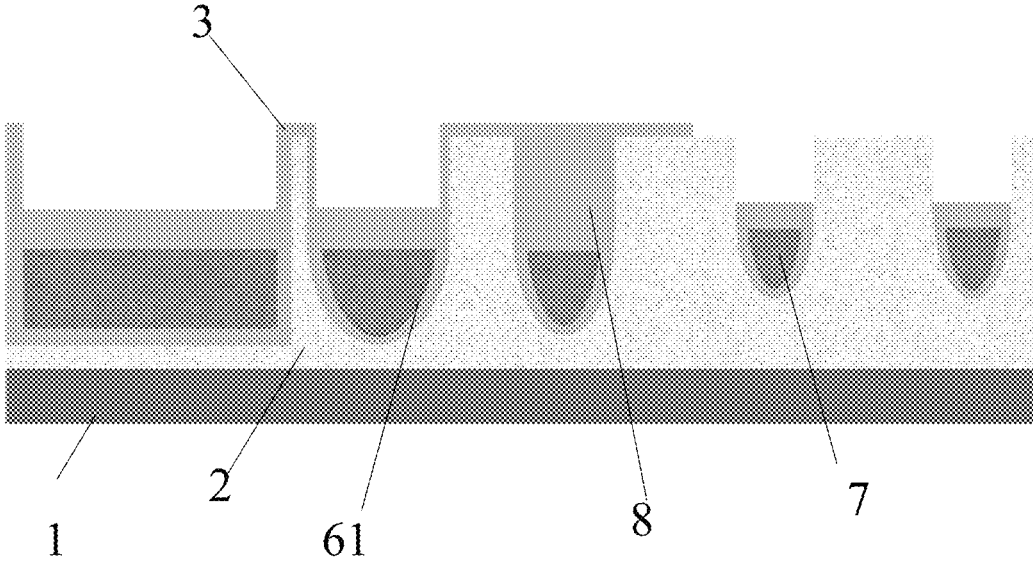
FIG. 8 is a process schematic diagram of step S6 of the manufacturing method of the contact holes of the SGT MOSFET device according to Embodiments 1-3 of the present disclosure.

S6: as shown in FIG. 8, etching portions of the oxide layer 8 arranged inside the gate trench, the pre-embedded ESD trench, and the source trenches to form a shielding oxide layer, specifically, exposing a pattern of a mask on fifth photoresist under the yellow light, and then etching portions of the oxide layer 8 arranged in the gate trench, the pre-embedded ESD trench, and the source trenches through the dry etching or wet etching;

A thickness of the shielding oxide layer is controlled at about 250 nanometers, and the fifth photoresist is removed after the etching is completed.

Figure 9:
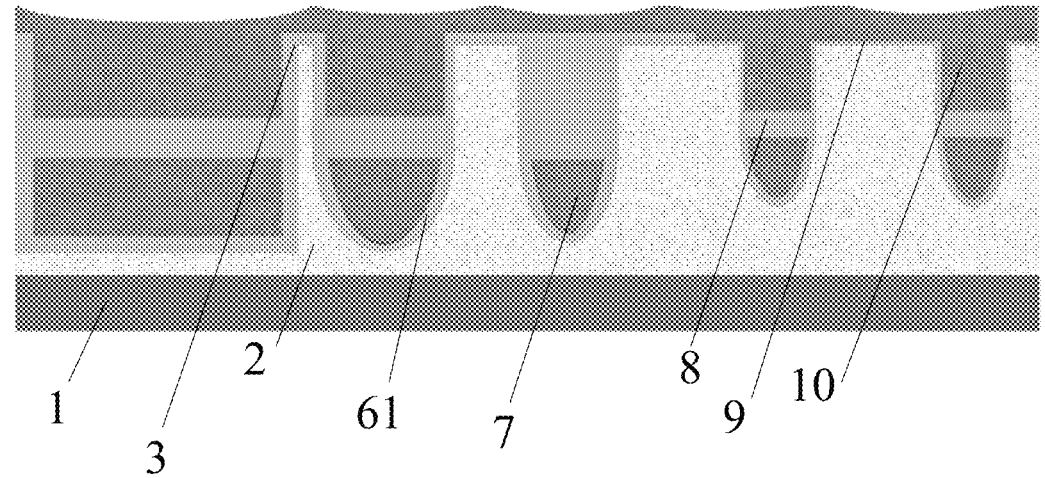
FIG. 9 is a process schematic diagram of step S7 of the manufacturing method of the contact holes of the SGT MOSFET device according to Embodiments 1-3 of the present disclosure.

S7: as shown in FIG. 9, preparing a gate oxide layer 9 and a second polysilicon layer 10, specifically, removing a portion of the oxide layer 8 arranged inside the gate trench by the wet etching; growing the gate oxide layer 9 having a thickness of 500 nm on the upper surfaces of the source trenches by the thermal oxidation method; growing a second polysilicon layer 10 having a thickness of 700 nm on the gate oxide layer 8 and an upper surface of the shielding oxide layer through a furnace tube;

The second polysilicon layer completely fills the pre-embedded ESD trench, the gate trench, the shielding gate trench, and the source trenches.

Figure 10:
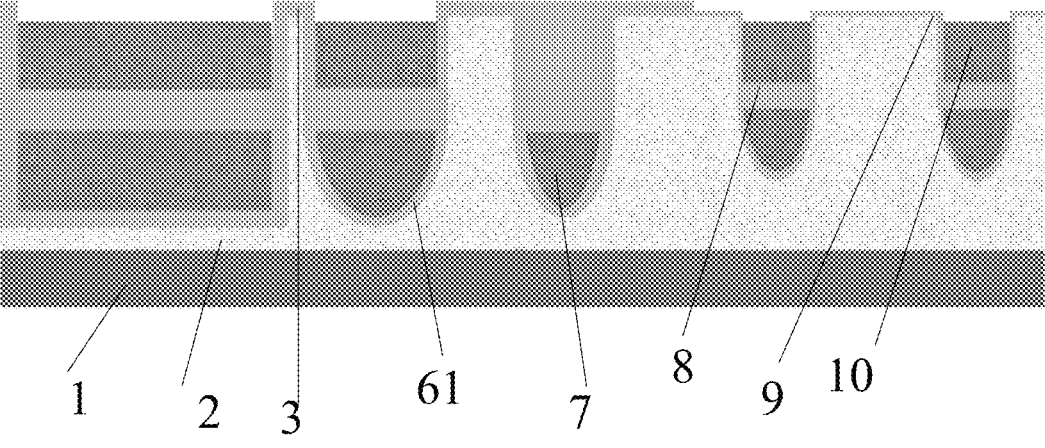
FIG. 10 is a process schematic diagram of step S8 of the manufacturing method of the contact holes of the SGT MOSFET device according to Embodiments 1-3 of the present disclosure.

S8: as shown in FIG. 10, planarizing the second polycrystalline silicon layer 10 through the CMP, etching the second polycrystalline silicon layer 10 through the dry etching;

An etching depth of the second polycrystalline silicon layer 10 is 200 nm.

Figure 11:
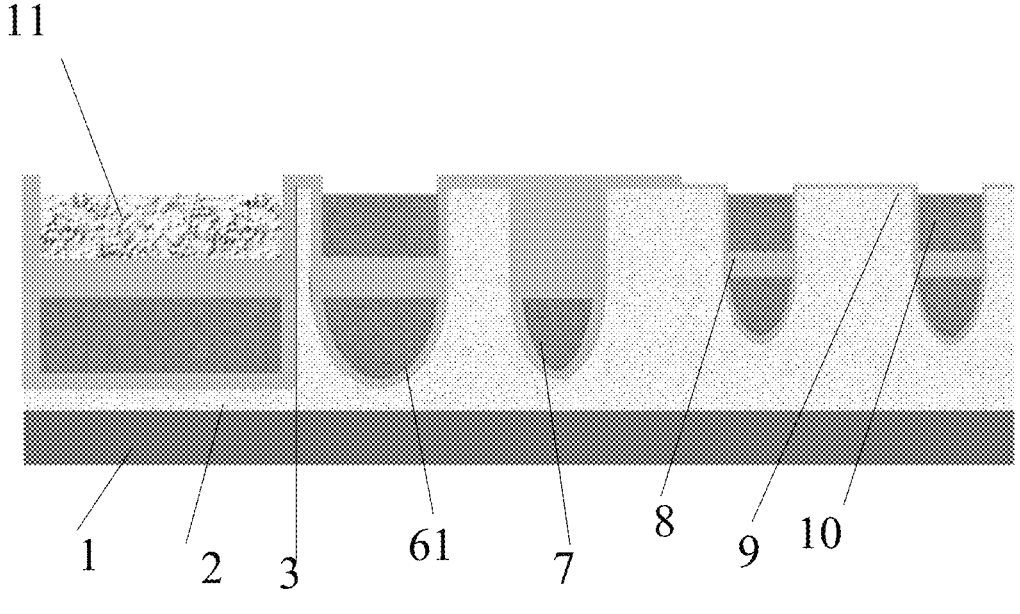
FIG. 11 is a process schematic diagram of step S9 of the manufacturing method of the contact holes of the SGT MOSFET device according to Embodiments 1-3 of the present disclosure.

S9: as shown in FIG. 11, obtaining an ESD region 11 on the pre-embedded ESD trench by performing the ion implantation, specifically, exposing the pattern of the mask on a second photoresist by the yellow light, performing the ion implantation on a portion of the second polysilicon layer 10 arranged in the ESD trench;

According to the polarity of the MOSFET, first impurities doped in the ESD region and implanted by the ion implantation are the trivalent element (boron) or the pentavalent element (arsenic, phosphorus). In the embodiment, the first impurities are boron and thermal activation is performed on the first impurities.

Figure 12:
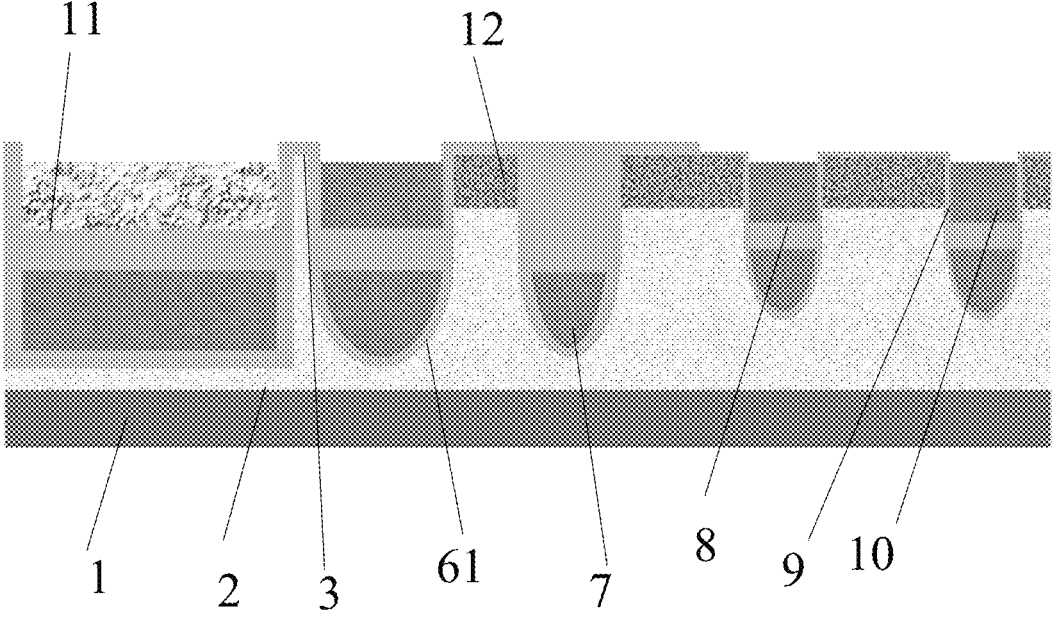
FIG. 12 is a process schematic diagram of step S10 of the manufacturing method of the contact holes of the SGT MOSFET device according to Embodiments 1-3 of the present disclosure.

S10: as shown in FIG. 12, obtaining a body region 12 by performing the ion implantation on a region between the gate trench and the shielding gate trench, a region between the shielding gate trench and the source trench, a region between the shielding gate trench and the source trenches, a region between the source trenches, and an upper portion of a portion of the epitaxial layer arranged on one side of the source trenches away from the gate trench;

According to the polarity of the MOSFET, second impurities doped in the body region and implanted by the ion implantation are the trivalent element (boron) or the pentavalent element (arsenic, phosphorus). In the embodiment, the second impurities are boron and thermal activation is performed on the second impurities.

Figures 13, 14:
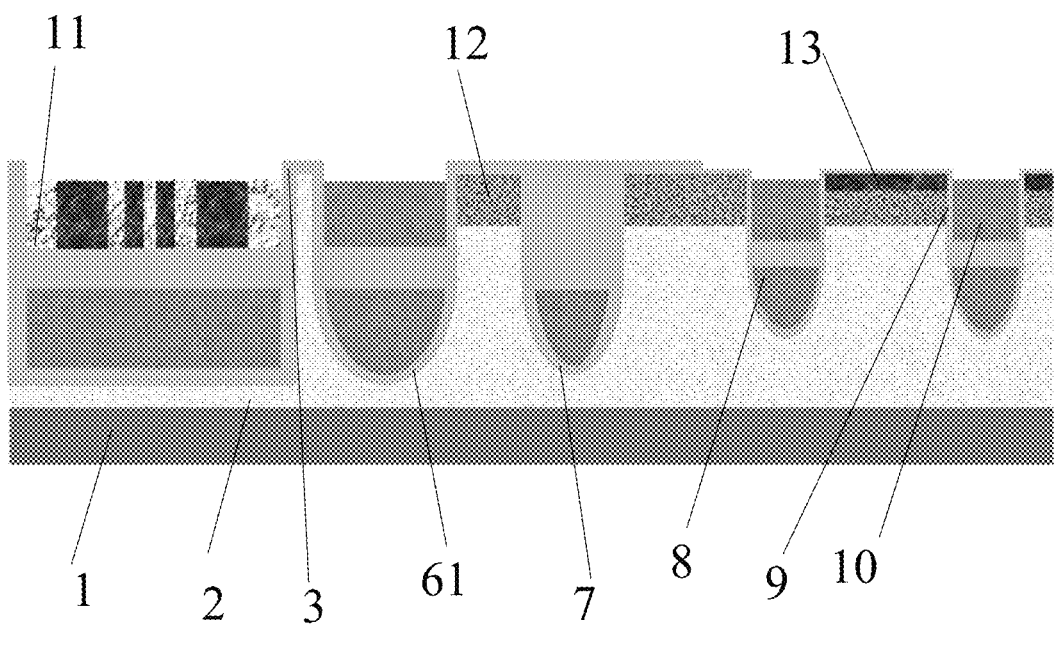
FIG. 13 is a process schematic diagram of step S11 of the manufacturing method of the contact holes of the SGT MOSFET device according to Embodiments 1-3 of the present disclosure.
FIG. 14 is a process schematic diagram of step S12 of the manufacturing method of the contact holes of the SGT MOSFET device according to Embodiments 1-3 of the present disclosure.

S11: as shown in FIG. 13, exposing the pattern of the mask to the third photoresist through the yellow light, obtaining the source region 13 by performing the ion implantation on the region between the source trenches and the upper portion of the one side of the source trenches away from the gate trench;

According to the polarity of the MOSFET, third impurities doped in the source region 13 and implanted by the ion implantation are the trivalent element (boron) or the pentavalent element (arsenic, phosphorus). In the embodiment, the third impurities are phosphorus.

S12, as shown in FIG. 14, growing a silicon dioxide insulating layer 14 on an upper surface of the cell structure by the CVD; and The silicon dioxide insulating layer 14 may be doped with fourth impurities including boron and phosphorus, so as to improve fluidity of a film and adsorption of external impurities.

Figure 15:
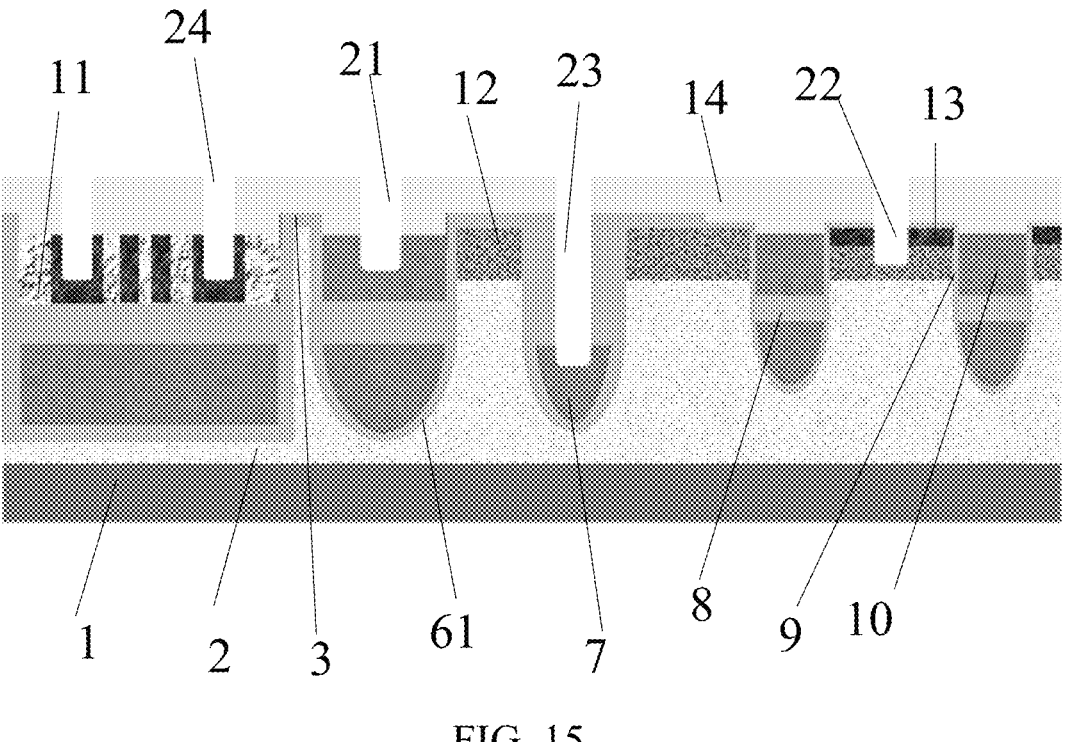
FIG. 15 is a process schematic diagram of step S13 of the manufacturing method of the contact holes of the SGT MOSFET device according to Embodiments 1-3 of the present disclosure.

S13: as shown in FIG. 15, exposing the pattern of the mask on the fourth photoresist by the yellow light, and obtaining the gate contact hole 21, the source contact hole 22, the shielding gate contact hole 23, and the ESD contact holes by the dry etching; and removing the fourth photoresist after the dry etching.

Figure 1:
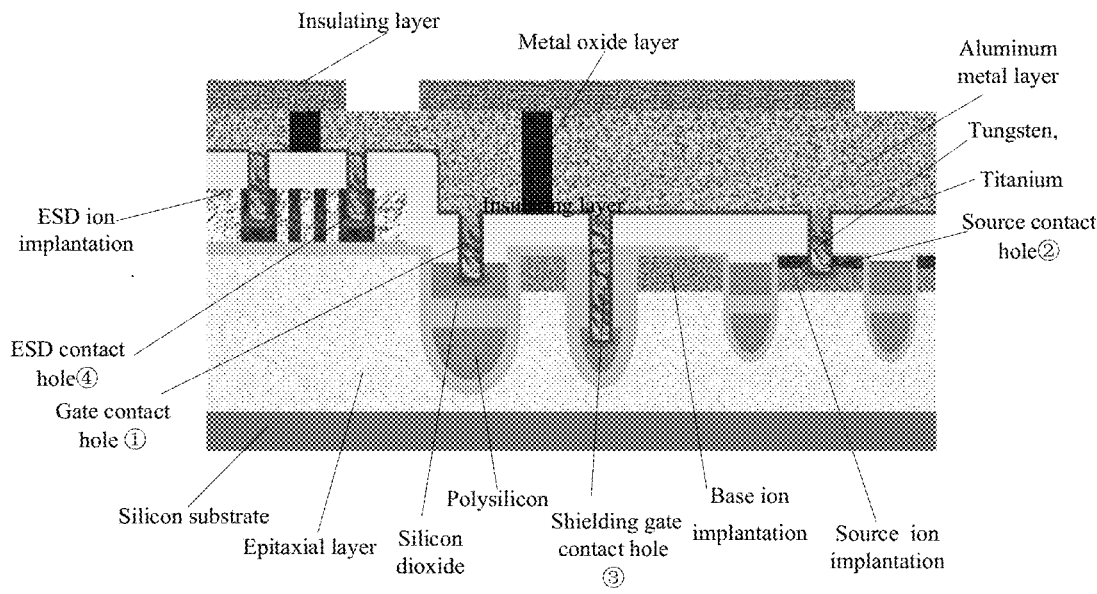
FIG. 1 is a structural schematic diagram of a conventional SGT MOSFET device with an ESD structure in the prior art.
Figure 2:
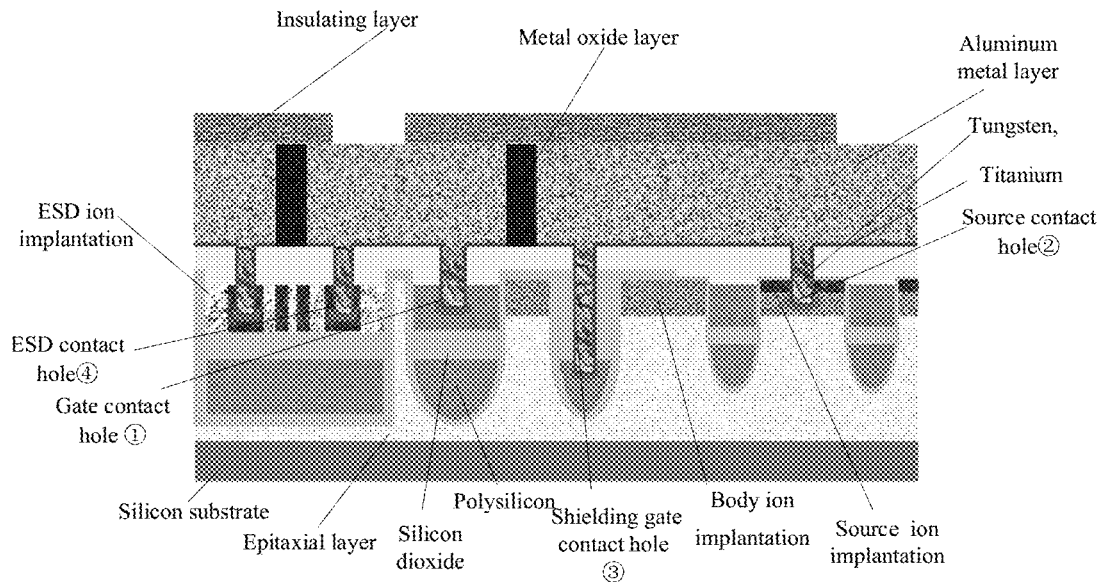
FIG. 2 is a structural schematic diagram of a SGT MOSFET device according to Embodiments 1-3 of the present disclosure.

Subsequent processes of ion implantation of the contact holes, silicon metallization, metal tungsten deposition on the contact holes, aluminum metal interconnection, passivation of a protection layer, alloy and etc. are consistent with conventional processes, and a structure of the SGT MOSFET device obtained is shown in FIG. 2.

Compared with a conventional ESD structure, by pre-embedding the ESD structure into the SGT MOSFET device, depth differences between the gate contact hole 21, the source contact hole 22, the shielding gate contact hole 23, and the ESD contact holes 24 are reduced, and all of the contact holes are prepared by only one photolithography process. The manufacturing method reduces a photolithography process and a process of growing an ESD polysilicon, and saves cost. Moreover, the manufacturing method reduces difficulty of a manufacturing process.

Embodiment 2

The present disclosure provides a manufacturing method of contact holes of the SGT MOSFET device. The manufacturing method comprises following steps:

S1: as shown in FIG. 3, preparing the epitaxial layer 2 on the upper surface of the silicon substrate 1 by CVD; depositing the oxide layer mask 3 on the upper surface of the epitaxial layer 2 according to the polarity of the MOSFET;

The epitaxial layer 2 is doped with the trivalent element or the pentavalent element. The epitaxial layer 2 is the single-layer structure or a multi-layer structure according to the operation voltage. The epitaxial layer 2 has a thickness of 0.5 microns. The oxide layer mask 3 comprises silicon dioxide or silicon nitride.

S2: as shown in FIG. 4, preparing the gate trench 4, the source trenches 5, the shielding gate trench, and the ESD trench 6, specifically, spin-coating the first photoresist on the upper surface of the oxide layer mask 3, defining the trench pattern by exposing the first photoresist under yellow light;

and obtaining the pre-embedded ESD trench 6, the gate trench 4, the shielding gate trench, and the source trenches 5 by the dry etching, and removing the first photoresist after the dry etching is completed;

S3: as shown in FIG. 5, growing the insulating layer 61 having a thickness of 20 nm on the upper surfaces of the pre-embedded ESD trench 6, the gate trench 4, the shielding gate trench, and the source trenches 5 by the thermal oxidation method; growing the first polysilicon layer 7 having a thickness of 100 nm on the upper surface of the insulating layer 61;

The first polysilicon layer 7 completely fills the pre-embedded ESD trench, the gate trench, the shielding gate trench, and the source trenches;

S4: as shown in FIG. 6, removing the portion of the first polysilicon layer 7 above the mask layer by chemical mechanical polishing, and then etching remaining first polysilicon layer 7 by the dry etching;

The height of the first polysilicon layer 7 after the dry etching is 0.1-1 μm.

S5: as shown in FIG. 7, depositing the oxide layer 8 having a thickness of 500 nm by the HDP CVD; planarizing the oxide layer 8 through the CMP;

The oxide layer 8 completely fills the pre-embedded ESD trench, the gate trench, the shielding gate trench, and the source trenches.

S6: as shown in FIG. 8, etching the portions of the oxide layer 8 arranged inside the gate trench, the pre-embedded ESD trench, and the source trenches to form the shielding oxide layer, specifically, exposing the pattern of the mask on the fifth photoresist under the yellow light, and then etching the portions of the oxide layer 8 arranged in the gate trench, the pre-embedded ESD trench, and the source trenches through the dry etching or wet etching;

A thickness of the shielding oxide layer is controlled at about 50 nm, and the fifth photoresist is removed after the etching is completed.

S7: as shown in FIG. 9, preparing the gate oxide layer 9 and the second polysilicon layer 10, specifically, removing the portion of the oxide layer 8 arranged inside the gate trench by the wet etching; growing the gate oxide layer 9 having a thickness of 10 nm on the upper surfaces of the source trenches by the thermal oxidation method; growing the second polysilicon layer 10 having a thickness of 100 nm on the gate oxide layer 8 and the upper surface of the shielding oxide layer through the furnace tube;

The second polysilicon layer completely fills the pre-embedded ESD trench, the gate trench, the shielding gate trench, and the source trenches.

S8: as shown in FIG. 10, planarizing the second polycrystalline silicon layer 10 through the CMP, etching the second polycrystalline silicon layer 10 through the dry etching;

An etching depth of the second polycrystalline silicon layer 10 is 20 nm.

S9: as shown in FIG. 11, obtaining the ESD region 11 on the pre-embedded ESD trench by performing the ion implantation, specifically, exposing the pattern of the mask on the second photoresist by the yellow light, performing the ion implantation on the portion of the second polysilicon layer 10 arranged in the ESD trench;

According to the polarity of the MOSFET, the first impurities doped in the ESD region and implanted by the ion implantation are the trivalent element (boron) or the pentavalent element (arsenic, phosphorus). In the embodiment, the first impurities are phosphorus and thermal activation is performed on the first impurities.

S10: as shown in FIG. 12, obtaining the body region 12 by performing the ion implantation on the region between the gate trench and the shielding gate trench, the region between the shielding gate trench and the source trench, the region between the shielding gate trench and the source trenches, the region between the source trenches, and the upper portion of the portion of the epitaxial layer arranged on the one side of the source trenches away from the gate trench;

According to the polarity of the MOSFET, the second impurities doped in the body region and implanted by the ion implantation are the trivalent element (boron) or the pentavalent element (arsenic, phosphorus). In the embodiment, the second impurities are arsenic and thermal activation is performed on the second impurities.

S11: as shown in FIG. 13, exposing the pattern of the mask to the third photoresist through the yellow light, obtaining the source region 13 by performing the ion implantation on the region between the source trenches and the upper portion of the one side of the source trenches away from the gate trench;

According to the polarity of the MOSFET, the third impurities doped in the source region 13 and implanted by the ion implantation are the trivalent element (boron) or the pentavalent element (arsenic, phosphorus). In the embodiment, the third impurities are boron.

S12, as shown in FIG. 14, growing the silicon dioxide insulating layer 14 on the upper surface of the cell structure by the CVD; and The silicon dioxide insulating layer 14 may be doped with fourth impurities including boron and phosphorus, so as to improve the fluidity of the film and the adsorption of the external impurities.

S13: as shown in FIG. 15, exposing the pattern of the mask on the fourth photoresist by the yellow light, and obtaining the gate contact hole 21, the source contact hole 22, the shielding gate contact hole 23, and the ESD contact holes 24 by the dry etching; and removing the fourth photoresist after the dry etching.

Subsequent processes of ion implantation of the contact holes, silicon metallization, metal tungsten deposition on the contact holes, aluminum metal interconnection, passivation of the protection layer, alloy, etc. are consistent with conventional processes, and the structure of the SGT MOSFET device obtained is shown in FIG. 2.

Compared with the conventional ESD structure, by pre-embedding the ESD structure into the SGT MOSFET device, the depth differences between the gate contact hole 21, the source contact hole 22, the shielding gate contact hole 23, and the ESD contact holes 24 are reduced, and all of the contact holes are prepared by only one photolithography process. The manufacturing method reduces one photolithography process and one process of growing the ESD polysilicon, and saves cost. Moreover, the manufacturing method reduces difficulty of the manufacturing process.

Embodiment 3

The present disclosure provides the manufacturing method of contact holes of the SGT MOSFET device. The manufacturing method comprises following steps:

S1: as shown in FIG. 3, preparing the epitaxial layer 2 on the upper surface of the silicon substrate 1 by CVD; depositing the oxide layer mask 3 on the upper surface of the epitaxial layer 2 according to the polarity of the MOSFET;

The epitaxial layer 2 is doped with the trivalent element or the pentavalent element. The epitaxial layer 2 is the single-layer structure or the multi-layer structure according to the operation voltage. The epitaxial layer 2 has a thickness of 10 microns. The oxide layer mask 3 comprises silicon dioxide or silicon nitride.

S2: as shown in FIG. 4, preparing the gate trench 4, the source trenches 5, the shielding gate trench, and the ESD trench 6, specifically, spin-coating the first photoresist on the upper surface of the oxide layer mask 3, defining the trench pattern by exposing the first photoresist under yellow light; and obtaining the pre-embedded ESD trench 6, the gate trench 4, the shielding gate trench, and the source trenches 5 by the dry etching, and removing the first photoresist after the dry etching is completed;

S3: as shown in FIG. 5, growing the insulating layer 61 having a thickness of 500 nm on the upper surfaces of the pre-embedded ESD trench 6, the gate trench 4, the shielding gate trench, and the source trenches 5 by the thermal oxidation method; growing the first polysilicon layer 7 having a thickness of 1200 nm on the upper surface of the insulating layer 61;

The first polysilicon layer 7 completely fills the pre-embedded ESD trench, the gate trench, the shielding gate trench, and the source trenches;

S4: as shown in FIG. 6, removing the portion of the first polysilicon layer 7 above the mask layer by chemical mechanical polishing, and then etching remaining first polysilicon layer 7 by the dry etching;

The height of the first polysilicon layer 7 after the dry etching is 0.1-1 μm.

S5: as shown in FIG. 7, depositing the oxide layer 8 having a thickness of 3000 nm by the HDP CVD; planarizing the oxide layer 8 through the CMP;

The oxide layer 8 completely fills the pre-embedded ESD trench, the gate trench, the shielding gate trench, and the source trenches.

S6: as shown in FIG. 8, etching the portions of the oxide layer 8 arranged inside the gate trench, the pre-embedded ESD trench, and the source trenches to form the shielding oxide layer, specifically, exposing the pattern of the mask on the fifth photoresist under the yellow light, and then etching the portions of the oxide layer 8 arranged in the gate trench, the pre-embedded ESD trench, and the source trenches through the dry etching or wet etching;

A thickness of the shielding oxide layer is controlled at about 500 nm, and the fifth photoresist is removed after the etching is completed.

S7: as shown in FIG. 9, preparing the gate oxide layer 9 and the second polysilicon layer 10, specifically, removing the portion of the oxide layer 8 arranged inside the gate trench by the wet etching; growing the gate oxide layer 9 having a thickness of 1000 nm on the upper surfaces of the source trenches by the thermal oxidation method; growing the second polysilicon layer 10 having a thickness of 1200 nm on the gate oxide layer 8 and the upper surface of the shielding oxide layer through the furnace tube;

The second polysilicon layer completely fills the pre-embedded ESD trench, the gate trench, the shielding gate trench, and the source trenches.

S8: as shown in FIG. 10, planarizing the second polycrystalline silicon layer 10 through the CMP, etching the second polycrystalline silicon layer 10 through the dry etching;

An etching depth of the second polycrystalline silicon layer 10 is 200 nm.

S9: as shown in FIG. 11, obtaining the ESD region 11 on the pre-embedded ESD trench by performing the ion implantation, specifically, exposing the pattern of the mask on the second photoresist by the yellow light, performing the ion implantation on the portion of the second polysilicon layer 10 arranged in the ESD trench;

According to the polarity of the MOSFET, the first impurities doped in the ESD region and implanted by the ion implantation are the trivalent element (boron) or the pentavalent element (arsenic, phosphorus). In the embodiment, the first impurities are boron and the thermal activation is performed on the first impurities.

S10: as shown in FIG. 12, obtaining the body region 12 by performing the ion implantation on the region between the gate trench and the shielding gate trench, the region between the shielding gate trench and the source trench, the region between the shielding gate trench and the source trenches, the region between the source trenches, and the upper portion of the portion of the epitaxial layer arranged on the one side of the source trenches away from the gate trench;

According to the polarity of the MOSFET, the second impurities doped in the body region and implanted by the ion implantation are the trivalent element (boron) or the pentavalent element (arsenic, phosphorus). In the embodiment, the second impurities are boron and the thermal activation is performed on the second impurities.

S11: as shown in FIG. 13, exposing the pattern of the mask to the third photoresist through the yellow light, obtaining the source region 13 by performing the ion implantation on the region between the source trenches and the upper portion of the one side of the source trenches away from the gate trench;

According to the polarity of the MOSFET, the third impurities doped in the source region 13 and implanted by the ion implantation are the trivalent element (boron) or the pentavalent element (arsenic, phosphorus). In the embodiment, the third impurities are arsenic.

S12, as shown in FIG. 14, growing the silicon dioxide insulating layer 14 on the upper surface of the cell structure by the CVD; and The silicon dioxide insulating layer 14 may be doped with fourth impurities including boron and phosphorus, so as to improve the fluidity of the film and the adsorption of the external impurities.

S13: as shown in FIG. 15, exposing the pattern of the mask on the fourth photoresist by the yellow light, and obtaining the gate contact hole 21, the source contact hole 22, the shielding gate contact hole 23, and the ESD contact holes 24 by the dry etching; and removing the fourth photoresist after the dry etching.

Subsequent processes of ion implantation of the contact holes, silicon metallization, metal tungsten deposition on the contact holes, aluminum metal interconnection, passivation of the protection layer, alloy, etc. are consistent with conventional processes, and the structure of the SGT MOSFET device obtained is shown in FIG. 2.

Compared with the conventional ESD structure, by pre-embedding the ESD structure into the SGT MOSFET device, the depth differences between the gate contact hole 21, the source contact hole 22, the shielding gate contact hole 23, and the ESD contact holes 24 are reduced, and all of the contact holes are prepared by only one photolithography process. The manufacturing method reduces one photolithography process and one process of growing the ESD polysilicon, and saves cost. Moreover, the manufacturing method reduces difficulty of the manufacturing process.

Specific embodiments of the present disclosure are described above. It should be understood that the present disclosure is not limited to the specific embodiments described above, and those skilled in the art can make various changes or modifications within the scope of the claims, which does not affect the essential content of the present disclosure. In the case of no conflict, the embodiments of the present disclosure and the features in the embodiments may be combined with each other.

What is claimed is:

1. A manufacturing method of contact holes of a split-gate-trench (SGT) metal-oxide-semiconductor field-effect transistor (MOSFET) device, comprising following steps:

A: preparing a gate trench, source trenches, a shielding gate trench, and a pre-embedded electro-static discharge (ESD) trench;

B: preparing a cell structure;

C: preparing an ESD region, a body region, and a source region by ion implantation; and D: preparing a gate contact hole, a source contact hole, a shield gate contact hole, and ESD contact holes;

wherein the step B comprises:

S3: growing an insulating layer on upper surfaces of the pre-embedded ESD trench, the gate trench, the shielding gate trench, and the source trenches by a thermal oxidation method; growing a first polysilicon layer on an upper surface of the insulating layer; the first polysilicon layer completely fills the pre-embedded ESD trench, the gate trench, the shielding gate trench, and the source trenches;

S4: removing a portion of the first polysilicon layer above a mask layer by chemical mechanical polishing, and then etching remaining first polysilicon layer by the dry etching; wherein a height of the first polysilicon layer after the dry etching is 0.1-1 $\mu$m; the first polysilicon layer after the dry etching is respectively arranged inside the pre-embedded ESD trench, the gate trench, the shielding gate trench, and the source trenches;

S5: depositing an oxide layer by high density plasma (HDP) CVD; planarizing the oxide layer through chemical mechanical polishing (CMP); wherein the oxide layer completely fills the pre-embedded ESD trench, the gate trench, the shielding gate trench, and the source trenches;

S6: etching portions of the oxide layer arranged inside the gate trench, the pre-embedded ESD trench, and the source trenches to form a shielding oxide layer; wherein a thickness of the shielding oxide layer is 50-500 nm;

S7: removing a portion of the oxide layer arranged inside the gate trench by wet etching; growing a gate oxide layer on the upper surfaces of the source trenches by the thermal oxidation method; growing a second polysilicon layer on the gate oxide layer and an upper surface of the shielding oxide layer through a furnace tube; wherein a thickness of the gate oxide layer is 10-1000 nm; the second polysilicon layer completely fills the pre-embedded ESD trench, the gate trench, the shielding gate trench, and the source trenches; and S8: planarizing the second polycrystalline silicon layer through the CMP, etching the second polycrystalline silicon layer through the dry etching; wherein an etching depth of the second polycrystalline silicon layer is 20-200 nm.

2. The manufacturing method according to claim 1, wherein the step A comprises steps:

S1: preparing an epitaxial layer on an upper surface of a silicon substrate by chemical vapor deposition (CVD); depositing an oxide layer mask on an upper surface of the epitaxial layer; wherein the epitaxial layer is doped with a trivalent element or a pentavalent element; and S2: spin-coating a first photoresist on an upper surface of the oxide layer mask, defining a trench pattern by exposing the first photoresist under yellow light; and obtaining the pre-embedded ESD trench, the gate trench, the shielding gate trench, and the source trenches by dry etching, and removing the first photoresist after the dry etching is completed; wherein the pre-embedded ESD trench, the gate trench, the shielding gate trench, and the source trenches are sequentially arranged.

3. The manufacturing method according to claim 2, wherein in the step S1, the epitaxial layer is a single-layer structure or a multi-layer structure; the epitaxial layer has a thickness of 0.5-10 microns; the oxide layer mask comprises silicon dioxide or silicon nitride.

4. The manufacturing method according to claim 1, wherein in the step S3, a thickness of the insulating layer is 20-500 nm; a thickness of the first polysilicon layer is 100-1200 nm; a thickness of the oxide layer in the step S5 is 500-3000 nm; a thickness of the second polysilicon layer in the step S7 is 100-1200 nm.

5. The manufacturing method according to claim 1, wherein the step C further comprises:

S9: exposing a pattern of a mask to a second photoresist by a yellow light, obtaining the ESD region on the pre-embedded ESD trench by performing the ion implantation on a portion of the second polysilicon layer arranged in the ESD trench, wherein first impurities doped in the ESD region and implanted by the ion implantation comprise the trivalent element or the pentavalent element; performing thermal activation on the first impurities;

S10: obtaining the body region by performing the ion implantation on a region between the gate trench and the shielding gate trench, a region between the shielding gate trench and the source trench, a region between the source trenches, and an upper portion of a portion of the epitaxial layer arranged on one side of the source trenches away from the gate trench; wherein second impurities doped in the body region and implanted by the ion implantation comprise the trivalent element or the pentavalent element; performing thermal activation on the second impurities;

S11: exposing the pattern of the mask to a third photoresist through the yellow light, obtaining the source region by performing the ion implantation on the region between the source trenches and the upper portion of the one side of the source trenches away from the gate trench; wherein third impurities doped in the source region and implanted by the ion implantation comprise the trivalent element or the pentavalent element; and S12: growing a silicon dioxide insulating layer on an upper surface of the cell structure by the CVD.

6. The manufacturing method according to claim 5, wherein the trivalent element in the steps S9-S11 comprises boron; the pentavalent element in the steps S9-S11 comprises arsenic or phosphorus; in the step S12, the silicon dioxide insulating layer is doped with fourth impurities; the fourth impurities comprise boron and phosphorus.

7. The manufacturing method according to claim 5, wherein the step D further comprises: S13: exposing the pattern of the mask on a fourth photoresist by the yellow light, and obtaining the gate contact hole, the source contact hole, the shielding gate contact hole, and the ESD contact holes by the dry etching; and removing the fourth photoresist after the dry etching.

8. The manufacturing method according to claim 7, wherein a lower end of the gate contact hole is located in a middle of the second polysilicon layer in the gate trench, a lower end of the source contact hole is located in a middle of the body region between the source trenches, and a lower end of the shielding gate contact hole is located in a middle of a portion of the first polysilicon layer arranged in the shielding gate trench; a lower end of each of the ESD contact holes is located in a middle of the second polysilicon layer in the ESD trench after ESD ion implantation.

9. An SGT MOSFET device, comprising: contact holes prepared by the manufacturing method according to claim 1.

* * * * *